(12) United States Patent
Liu et al.

(10) Patent No.: US 8,666,722 B2
(45) Date of Patent: Mar. 4, 2014

(54) EFFICIENT DATA COMPRESSION FOR VECTOR-BASED STATIC TIMING ANALYSIS

(75) Inventors: Jinfeng Liu, Cupertino, CA (US); Brian Clerkin, Dublin (IE); Feroze P. Taraporevala, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 801 days.

(21) Appl. No.: 12/814,421

(22) Filed: Jun. 11, 2010

(65) Prior Publication Data

US 2011/0307226 A1    Dec. 15, 2011

(51) Int. Cl.
*G06F 17/50*    (2006.01)

(52) U.S. Cl.
USPC .......................................................... 703/14

(58) Field of Classification Search
None
See application file for complete search history.

(56) References Cited

U.S. PATENT DOCUMENTS

| | | | |
|---|---|---|---|
| 7,092,838 B1 | 8/2006 | Srinivas et al. | |
| 2004/0002844 A1* | 1/2004 | Jess et al. | 703/14 |
| 2007/0234253 A1* | 10/2007 | Soreff et al. | 716/6 |

OTHER PUBLICATIONS

Chen et al., A New Framework for Static Timing Analysis, Incremental Timing Refinement and Timing Simulation, 2000, IEEE, pp. 102-107.*
Veetil et al. "Efficient Monte Carlo based incremental statistical timing analysis", Design Automation Conference, 2008. DAC 2008. 45th ACM/IEEE, Jun. 8-13, 2008, pp. 676-681.

* cited by examiner

*Primary Examiner* — Omar F Fernandez Rivas
*Assistant Examiner* — Bernard E Cothran
(74) *Attorney, Agent, or Firm* — Bever, Hoffman & Harms, LLP; Jeanette S. Harms

(57) ABSTRACT

In a STA method, after accessing data sets regarding the IC, vectors of the data sets for STA can be generated. Each vector can include a base value and a plurality of tokens, wherein each token is quantized. For each vector, the data of the vector can be adjusted. Adjusting can include shifting a predetermined token to zero and adjusting the base value and remaining token values based on the shifting. Incremental compression can be applied within the vector by storing each token value as a difference versus its previous token value. Differential compression can then be applied by storing each token value as a difference versus a corresponding token value in a predetermined reference vector. A resulting vector can be stored. At this point, an operation for STA can be performed using multiple resulting vectors without de-quantizing or decompressing.

68 Claims, 14 Drawing Sheets

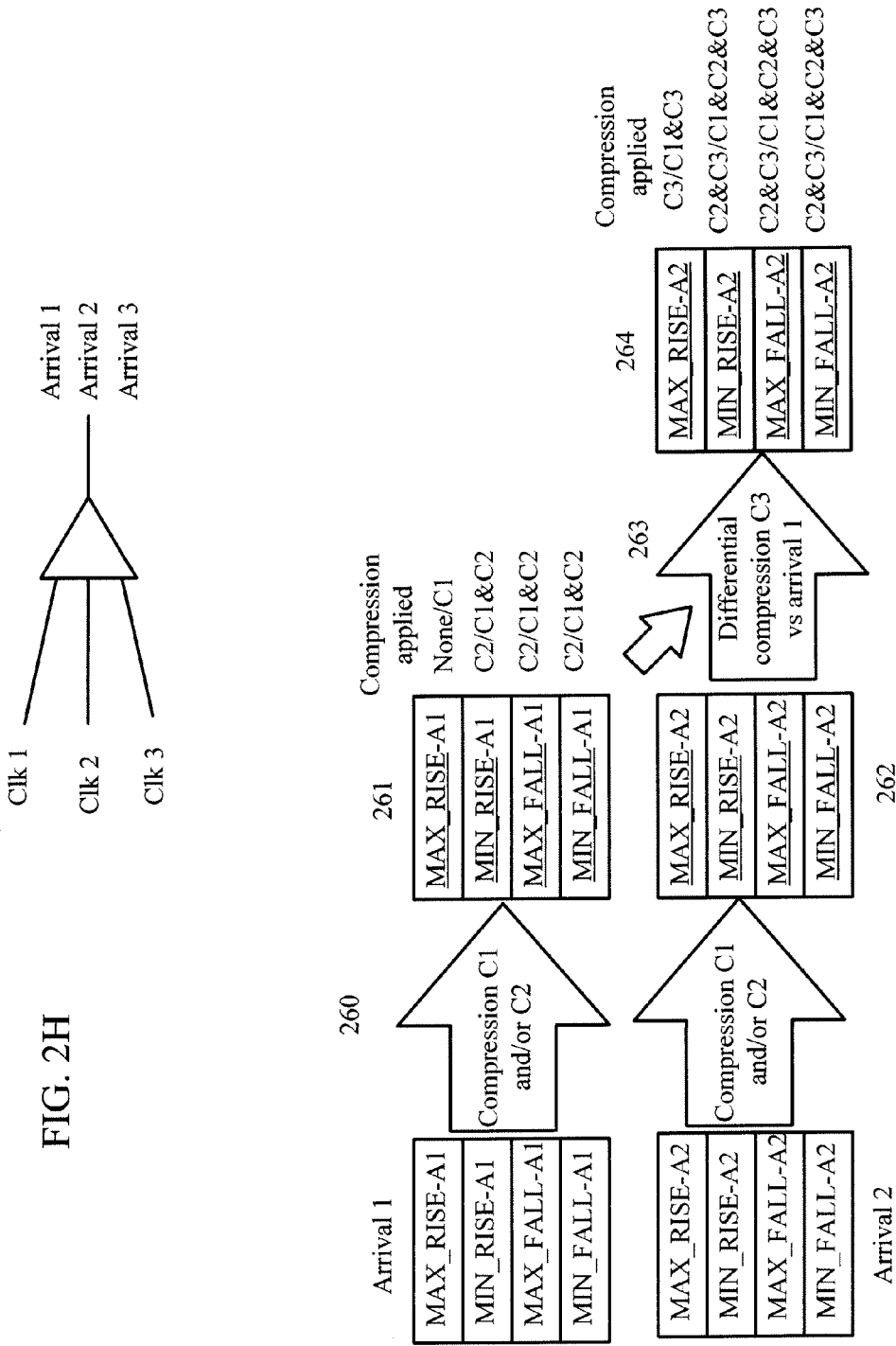

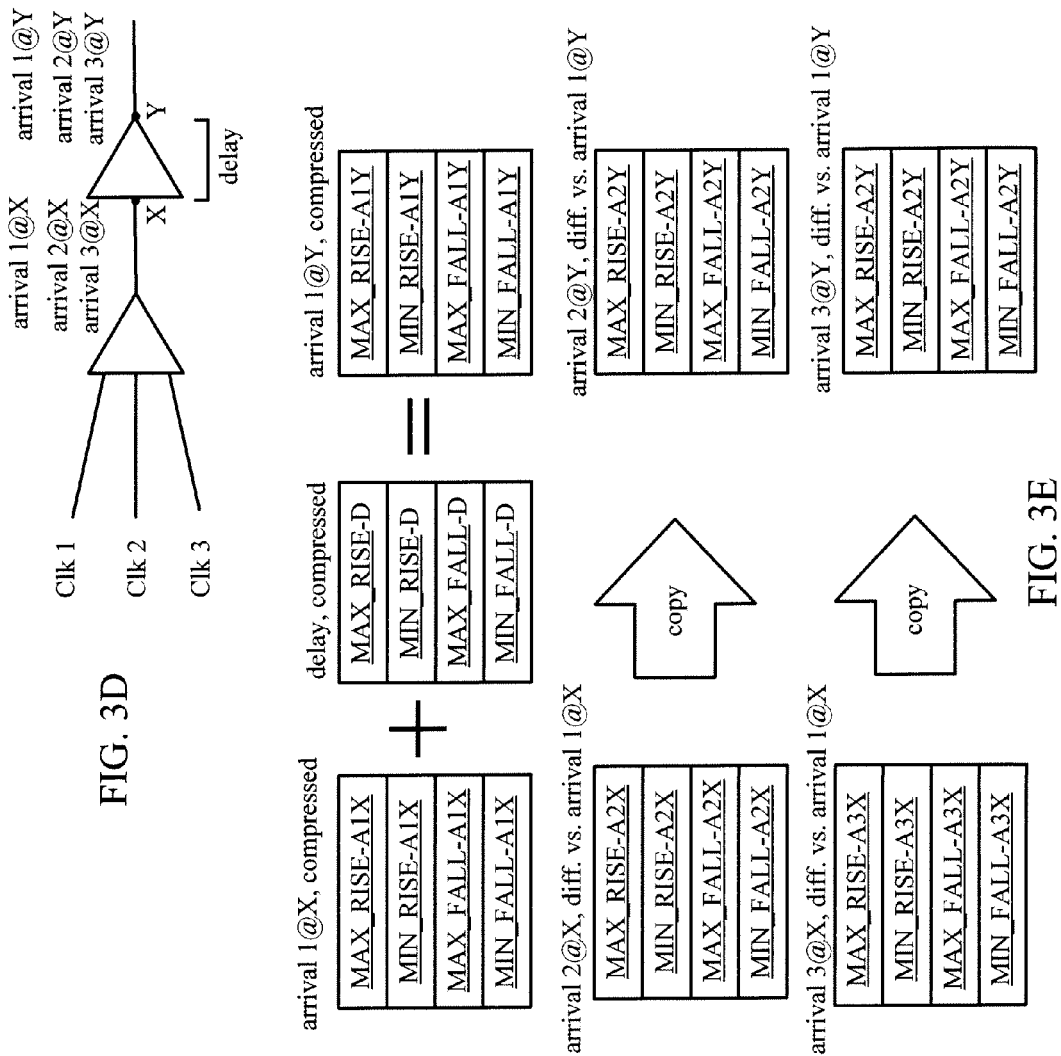

EFFICIENT DATA COMPRESSION FOR VECTOR-BASED STATIC TIMING ANALYSIS

BACKGROUND OF THE INVENTION

1. Field of the Invention

The present invention relates to static timing analysis (STA) and in particular to efficient data compression for vector-based static timing analysis.

2. Related Art

Large capacity and computation demands can be major bottlenecks in vector-based STA. In current deep submicron technologies, the timing performance of integrated circuits (ICs) is subject to significant process, voltage, and temperature variations. Multi-corner analysis continues to remain a commonly-adopted standard for sign-off quality STA.

Instead of running multiple STA at different corners, an efficient method may perform multi-corner analysis in a single vector-based STA, wherein vectors represent timing responses at multiple corners. More generally, each condition (i.e. a corner or mode) can correspond to one data point in the vector. Alternatively, Monte-Carlo based statistical STA (SSTA) can cover multiple corners in a single analysis. Due to the increasing amount of corners and modes, processing large vector data or statistical data can result in a prohibitive memory footprint.

Moreover, although the resulting data can be compressed using any manner of compression techniques, the processing of the data currently requires decompression of that data. Because data are typically accessed multiple times during processing while still trying to minimize the memory footprint, the data are repeatedly compressed and decompressed, thereby resulting in prohibitive runtime overhead.

Therefore, a need arises for efficient methods to reduce memory and runtime for applications of vector-based STA and SSTA associated with large-scale ICs.

SUMMARY OF THE INVENTION

Current techniques involving vector-based STA have large memory footprints even with compression. Moreover, processing of data in the vectors requires decompression. Because data in the vectors are typically accessed multiple times while still trying to minimize the memory footprint, the data are repeatedly compressed and decompressed, thereby resulting in prohibitive runtime overhead. This data can also be quantized, thereby requiring de-quantization and re-quantization during STA operations and further increasing runtime overhead.

An improved method of performing static timing analysis (STA) is described in which the memory footprint can be significantly reduced while allowing STA operations to be performed directly on the quantized and/or compressed data. Notably, this quantization and compression can ensure accurate results while significantly improving runtime efficiency compared to standard STA techniques.

For this method, data sets regarding the IC are accessed. Vectors of the data sets can be generated for STA, wherein each vector includes a base value and a plurality of offset values. Each offset value can then be quantized to an integer token value. After quantization, the data of the vector can be adjusted by shifting a predetermined token to zero and adjusting the base value and remaining token values accordingly. After shifting, incremental compression can be applied within the vector by storing each token value as a difference versus its previous token value. After applying incremental compression, differential compression can be applied by storing each token value as a difference versus a corresponding token value in a predetermined reference vector. A resulting vector can be stored based on this adjusting. Notably, an operation for STA can be performed using multiple resulting vectors without de-quantizing or decompressing. The operation for STA can be a mathematical operation or a statistical operation.

In one embodiment, the base value of the vector can be set to a minimum value in the data set. In another embodiment, the base value can be set to a maximum value in the data set. In yet another embodiment, the base value can be set to a mean value of the data set.

In one embodiment, a token range of the vector can be reduced before the operation is performed. This token range reduction can include dividing all the tokens by an integer, thereby decreasing the number of bits needed to store the tokens. In another embodiment, the plurality of tokens can be converted to a constant mean value to reduce noise if the dynamic range of data is small.

The multiple resulting vectors can include two resulting vectors associated with minimum/maximum circuit conditions for one attribute. For example, a first vector can be a maximum (MAX) vector, and a second vector can be a minimum (MIN) vector. In this case, the MAX vector can be stored as a reference vector. Differential compression can be performed across the MIN vector and the MAX vector. The MIN-MAX vector can then be stored as a new MIN vector. Notably, an operation for STA can be performed using these vectors without decompression.

In another embodiment, the multiple resulting vectors can include two resulting vectors associated with rise/fall circuit conditions for one attribute. For example, a first vector can be a rise (RISE) vector, and a second vector can be a fall (FALL) vector. In this case, the RISE vector can be stored as a reference vector. Differential compression can be performed across the FALL vector and the RISE vector. The FALL-RISE vector can then be stored as a new FALL vector. Notably, an operation for STA can be performed using these vectors without decompression.

In yet another embodiment, the multiple resulting vectors can include a first vector associated with minimum/maximum/rise/fall circuit conditions for one attribute. In this case, a MAX_RISE can be stored as a reference vector. Differential compression can be performed across a MIN_RISE and a MAX_RISE, a MAX_FALL and a MAX_RISE, and a MIN_FALL and a MAX_FALL to generate new vectors. Notably, an operation for STA can be performed using these vectors without decompression.

The multiple resulting vectors can include two resulting vectors associated with a condition for two correlated attributes, e.g. transition times of an upstream driver and a downstream load. In one embodiment, the driver vector can be used as a reference vector. Differential compression can be performed across the driver vector and the load vector. A differentially compressed vector can be stored as a new load vector. Notably, an operation for STA can be performed using these vectors without decompression. In a related embodiment, the multiple resulting vectors can include multiple resulting vectors associated with conditions for multiple correlated attributes, e.g. an upstream driver and multiple downstream loads.

In one embodiment, incremental compression can also be performed. In this case, each token other than the first token is re-computed based on the current value of the token minus the value of the previous token. The first token is assigned a zero value. Incremental compression can be used when token values are substantially monotonic, i.e. the differential values of adjacent tokens are within a predefined small range.

The multiple resulting vectors can also be associated with multiple correlated clock arrival times. In one embodiment, each of the multiple resulting vectors can include a MAX_RISE, a MIN_RISE, a MAX_FALL, and a MIN_FALL for a clock arrival time. Incremental and/or differential compression can be performed for each of these multiple resulting vectors. Notably, an operation for STA can be performed using these vectors without decompression.

In one embodiment, a post-operation vector can be adjusted using incremental compression. In one embodiment, the multiple resulting vectors can include minimum/maximum/rise/fall conditions for multiple attributes, such as arrival times at correlated pins. In yet another embodiment, each plurality of tokens can be packed into a register with predetermined bit width, thereby allowing a single machine instruction to perform STA operations for multiple tokens.

A computer readable storage device for performing static timing analysis (STA) of an integrated circuit (IC) is also described. This computer readable storage device can store instructions to cause at least one processor to perform the above-described steps.

BRIEF DESCRIPTION OF THE FIGURES

FIG. 2H illustrates multiple clock signals that have separate arrival times at the output of a logic gate.

FIG. 2I illustrates that differential compression can also be performed across vectors of multiple arrivals, e.g. the three arrival times shown in FIG. 2H.

FIG. 3D illustrates two coupled logic gates, wherein the upstream logic gate receives three clock signals Clk 1, Clk 2, and Clk 3, and X and Y designate the input and output pins of the downstream logic gate.

FIG. 3E illustrates a generic exemplary math operation that can be performed on the multi-level compressed vectors of FIG. 3D without decompressing or loss of accuracy.

DETAILED DESCRIPTION OF THE FIGURES

Current techniques involving vector-based STA have large memory footprints even with compression. Moreover, processing of data in the vectors requires decompression. Because data in the vectors are typically accessed multiple times while still trying to minimize the memory footprint, the data are repeatedly compressed and decompressed, thereby resulting in prohibitive runtime overhead.

Figure 1A:
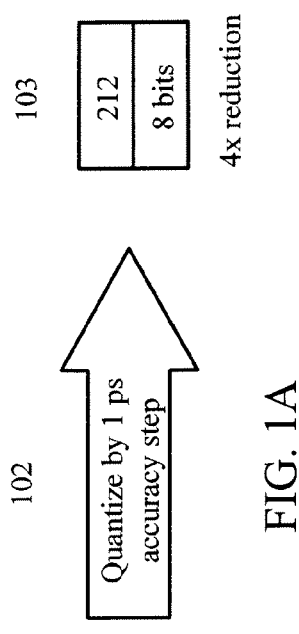
FIG. 1A illustrates an exemplary single-value quantization of a timing attribute.

In accordance with vectorized quantization, floating point vectors can be converted to discrete integer vectors that encode the dynamic range in very compact format. Moreover, these discrete integer vectors can allow direct STA processing, thereby eliminating the penalty associated with repeated quantizing/de-quantizing and/or decompressing/compressing. FIG. 1A illustrates an exemplary single-value quantization of a timing attribute. In this example, a delay value 101 is single-precision floating point of 212.35, which requires 32 bits to store. Step 102 can quantize (round up/down to an integer value) delay value 212 using a 1 picosecond (ps) accuracy step to provide a quantized delay value 103 of 212. Notably, saving quantized delay value 103 requires only 8 bits, thereby resulting in a 4× reduction of storage compared to delay value 101. Note that quantized delay value 103 has ±0.5 ps accuracy.

Figure 1B:
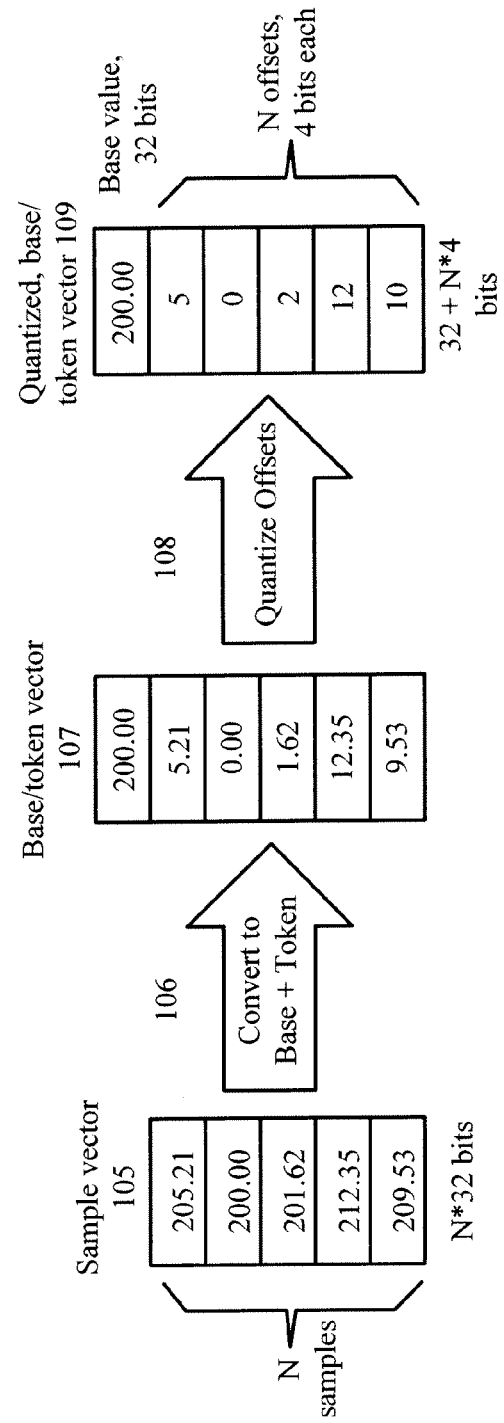
FIG. 1B illustrates an exemplary vectorized quantization of N samples forming part of a sample vector. In this case, the base value of a formed base/token vector can indicate the minimum sample value and the tokens of the vector can indicate the offsets of each sample from the base value.

FIG. 1B illustrates an exemplary vectorized quantization of N samples forming part of a sample vector 105, wherein N is an integer >1. In this example, the N=5, and the samples in sample vector 105 are 205.21, 200.00, 201.62, 212.35, and 209.53. Note that each sample is a single-precision floating point value, which takes 32 bits to store. Therefore, in general, storing sample vector 105 takes N*32 bits. Where N=5, as is the case for sample vector 105, then 160 bits are needed.

Step 106 can convert sample vector 105 into a vector 107 including a base value and a plurality of offset values. In this example, 200.00 can be designated the base value, which corresponds to the smallest sample of vector 107, and the offsets can indicate the difference of each sample of vector 105 from the base value (e.g. 205.21−200.00=5.21 and 209.53−200.00=9.53).

Step 108 can quantize the offsets of vector 107 to generate a quantized base/token vector 109 with a quantization step of 1 ps. Note that the base value can be expressed with 32 bits and the N quantized offsets can be expressed as N tokens with N*4 bits. Thus, quantized base/token vector 109 would need 32+20=52 bits, which is a significant reduction compared to the storage required for vector 105. Note that as N increases, the actual reduction can advantageously increase. Specifically, for a large N, which is typical in current vector-based STAs, a quantized base/token vector can provided up to an 8× reduction in memory compared to that for a single-precision, floating point vector. This type of vectorization and quantization is particularly effective where the samples values are within a finite range with respect to the quantization step.

Figure 1C:
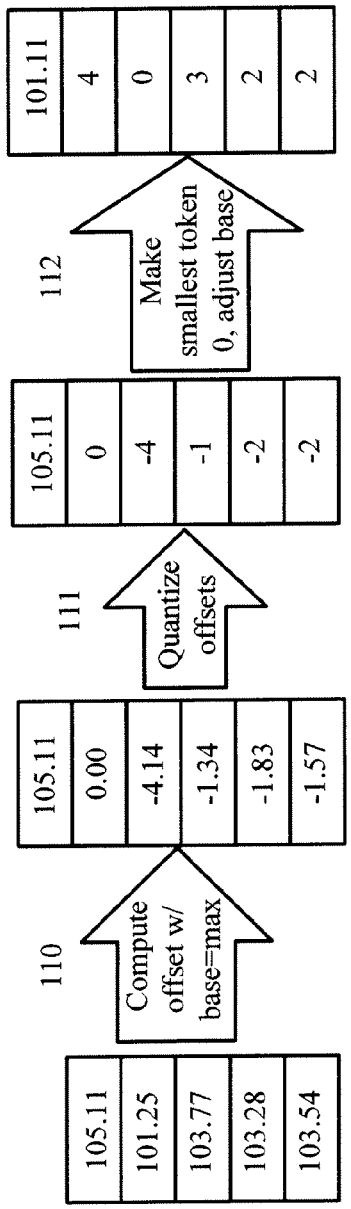
FIG. 1C illustrates a base/token vector in which the base value can indicate the maximum sample value and the tokens can indicate the offsets of each sample from the base value.

In one embodiment shown in FIG. 1C, the base value can the maximum sample value (instead of the minimum sample value, shown in FIG. 1B) and the offsets can indicate the difference of each sample from the base value, as computed by step 110. This computation results in one offset value of "0" and N−1 negative offsets. At this point, step 111 can quantize all offsets and step 112 can adjust the most negative quantized offset (i.e. the smallest token) to "0" and adjust the base value accordingly. This type of vectorized quantization using base=maximum can provide no error in the maximum token and a −0.14 ps error in the minimum token.

Figure 1D:
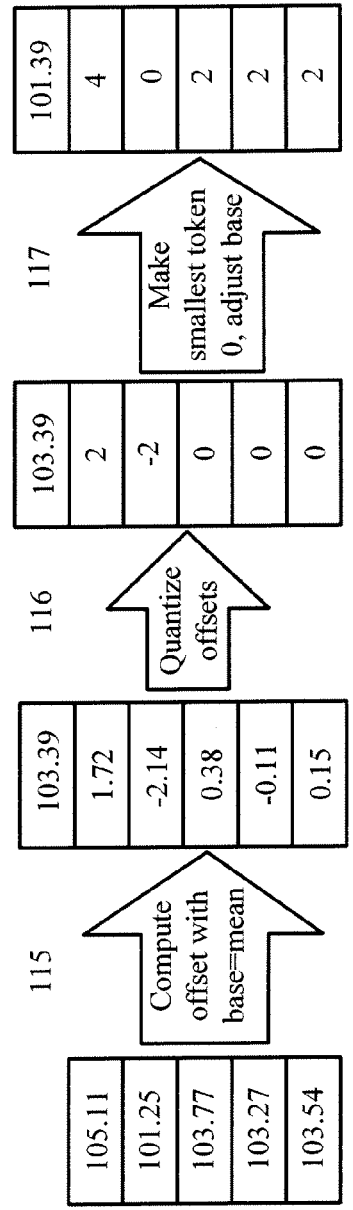
FIG. 1D illustrates a base/token vector in which the base value can be the mean of the sample values, and the tokens can indicate the offsets of each sample from that base value.

In another embodiment shown in FIG. 1D, the base value can be the mean of the sample values, and the offsets can indicate the difference of each sample from that base value, as computed by step 115. This computation results in at least one positive offset and at least one negative offset. At this point, step 116 can quantize all offsets to the nearest integer and step 117 can adjust the most negative quantized offset (i.e. the smallest token) to "0" and adjust the base value accordingly. This type of vectorized quantization using base=mean can provide an error of 0.28 ps in the maximum token and a 0.14 ps error in the minimum token.

Figure 1E:
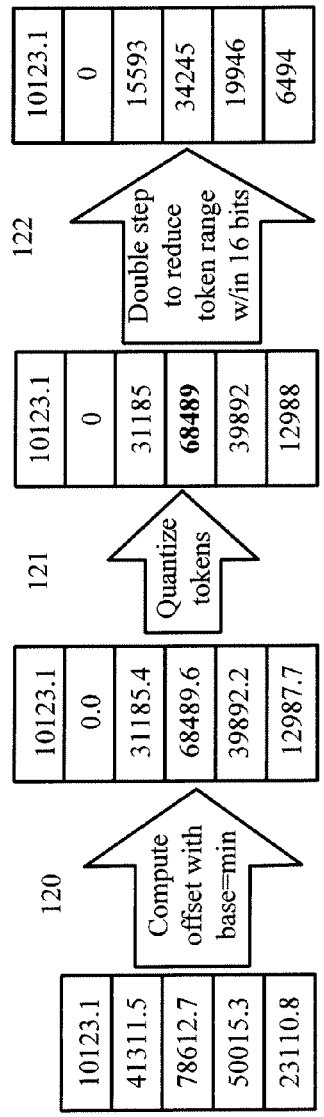
FIG. 1E illustrates a base/token vector in which the base value can be the minimum sample value, and the tokens can indicate the offsets of each sample from that base value. An additional step can be used to reduce the token range.

In yet another embodiment adapted to a large sample range shown in FIG. 1E, the base value can be the minimum sample value, and the offsets can indicate the difference of each sample from that base value, as computed by step 120. This computation results one zero offset and N−1 positive offsets. At this point, step 121 can quantize all offsets to the nearest integer. Noting that at least one token, i.e. 68489, cannot be expressed in 16 bits (i.e. maximum value is 65535), step 122 can reduce the token range to within 16 bits. Note that although 16 bits are discussed for this embodiment, other embodiments may have a different number of bits characterized as a maximum desired number of bits. In one embodiment of step 122, token range reduction can include dividing all tokens by 2 as the resulting values (shown in final vector). Note that other embodiments of step 122 could divide the tokens by another number and/or could use a different mathematical function. This type of vectorized quantization using token reduction can provide a 2× data reduction with insignificant accuracy loss due to the large data range.

Figure 1F:
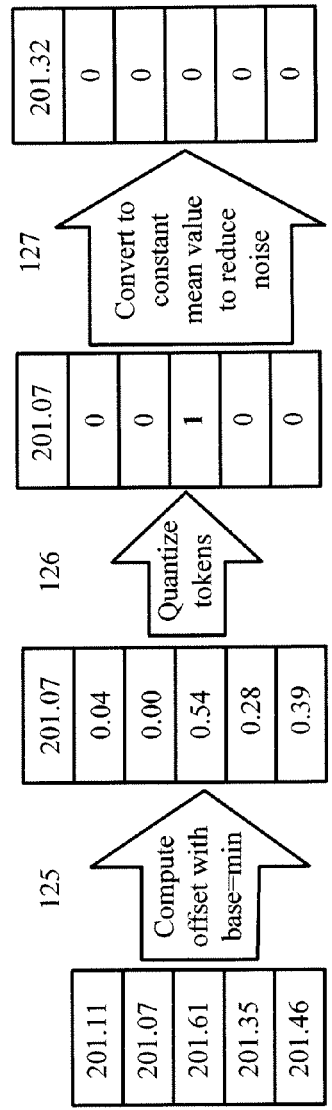
FIG. 1F illustrates a base/token vector in which the base value can be based on a minimum sample value, and the tokens can indicate the offsets of each sample from that base value. When the quantized tokens are effectively zero, the base can be adjusted based on the mean value of the tokens and all tokens can then be zeroed.

In yet another embodiment adapted to a small sample range shown in FIG. 1F, the base value can be the minimum sample value, and the offsets can indicate the difference of each sample from that base value, as computed by step 125. This computation results in one zero offset and N−1 positive offsets within a small range. At this point, step 126 can quantize all offsets to the nearest integer. Then, to reduce noise (i.e. maximum offset=1), step 127 can adjust the base value and the tokens based on a constant mean value of the offsets (in this case 0.25) and then re-quantize the offsets (in this case to zero). This type of vectorized quantization using mean value conversion can provide a high compression ratio with good accuracy for small data ranges.

Note that in one embodiment, the base value of the vectors can also be quantized. For example, referring to FIG. 1E, the base value of 10123.1 could also be quantized in step 121, thereby generating a base value of 10123. This additional quantization advantageously provides further compaction (i.e. an integer representation requires fewer bits than its corresponding floating point representation) with negligible accuracy loss. Thus, all data (base+tokens) in that vector would then have a granularity of 1 ps. Note that in other embodiments, the granularity of any quantized vector data can be different, e.g. 2 ps, 3 ps, 4 ps etc.

Figure 2A:
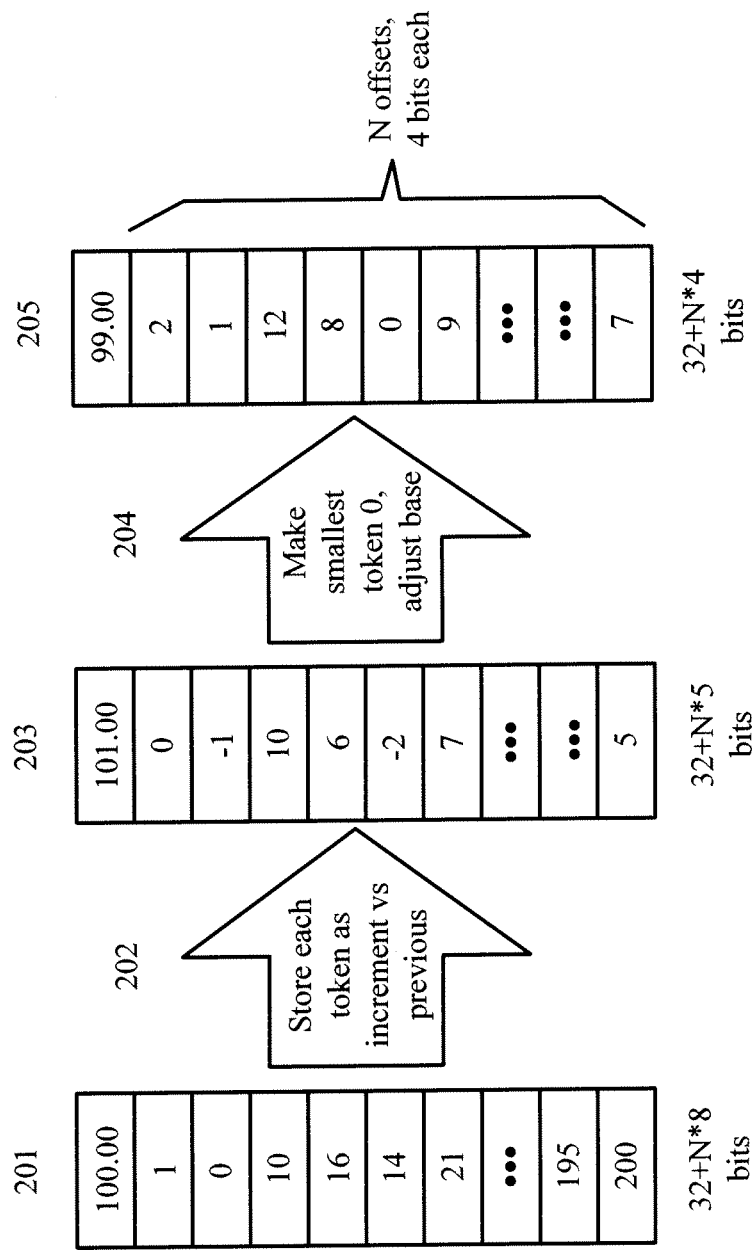
FIG. 2A illustrates that incremental compression can be performed within one vector for adjacent tokens that are within a defined small range, i.e. substantially monotonic.

In one embodiment shown in FIG. 2A, incremental compression can be performed within one vector for adjacent tokens that are within a defined small range, i.e. substantially monotonic. For example, a vector 201 includes a plurality of tokens ranging from 0 to 200. Notably, adjacent values are within 20 ps of each other (e.g. <10% of min to max values), which are considered substantially monotonic for this embodiment. Note that the values between 21 and 195 are not shown for simplicity, but conform to the above-described adjacency condition. Further note that this condition can apply to roughly increasing token values, roughly decreasing token values, or token values having adjacent differential values within the defined range.

This incremental compression can include storing each token as the difference of the increment token and the previous token, as determined by step 202. For example, for the second token of vector 203, 0−1=−1 (from vector 201). Similarly, 10−0=10; 16−10=6; 14−16=−2; 21−14=7; and 200−195=5. Note that in this embodiment, the first token of vector 203 is shifted to zero and thus the base value is accordingly adjusted to 100.00+1=101.00. Step 204 can make the smallest token of vector 203 zero, with adjustments made to the base value and all tokens of vector 205. In this case, because the smallest token value of vector 203 is −2, all tokens can be adjusted by +2, and the base value can be adjusted by −2.

Different types of compression are described herein. For purposes of distinguishing between these different types of compression, incremental compression performed within one vector (FIG. 2A showing one example) is designated C1.

Differential compression can be performed across vectors of one attribute, which is designated C2 compression. Note that, by definition, each attribute (which is associated with one circuit, standard cell, pin, etc.) can be represented by a vector. A minimum/maximum (MIN/MAX) of a circuit refers to when the circuit is running slow (MAX) or running fast (MIN). Notably, each base/token position of the vector is associated with a specific condition that applies to both MIN and MAX. Therefore, when looking at a MIN vector and a MAX vector for a circuit (for example), the two vectors typically demonstrate a high degree of correlation.

Figure 2B:
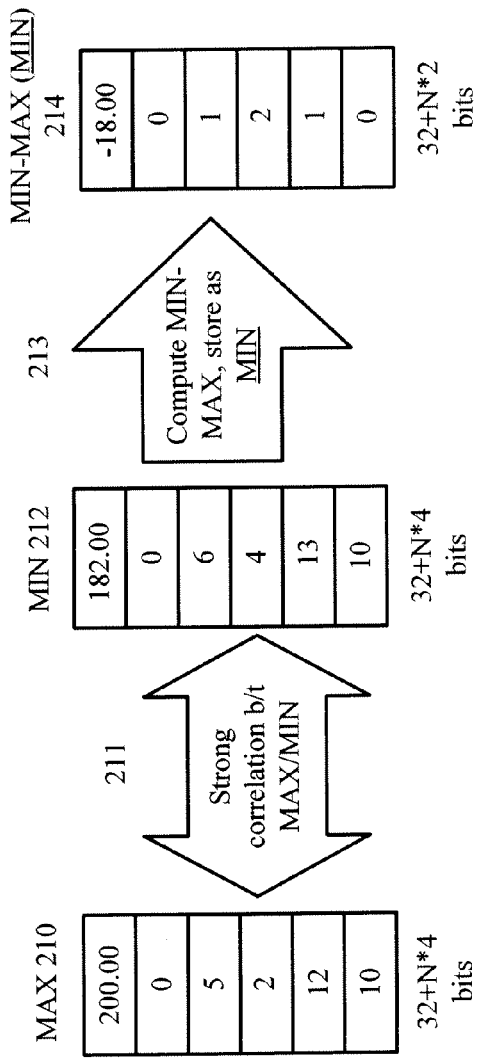
FIG. 2B illustrates differential compression being performed across vectors of one attribute.

For example, in FIG. 2B, MAX vector 210 includes a base value 200.00 and offsets of 0, 5, 2, 12, and 10. MIN vector 211 includes a base value 182.00 and offsets of 0, 6, 4, 13, and 10. Because of the high correlation between vectors 210 and 212, as determined by step 211, a MIN-MAX vector 214 can be generated in step 213. In one embodiment, differential vector MIN-MAX vector 214 can be stored as $\overline{\text{MIN}}$ vector 214 (wherein the underline indicates a $\overline{\text{differential}}$ compression has been performed). Note that MAX vector 210 can be stored as a reference vector.

The rise/fall of a circuit refers to a signal in a circuit going from logic 0 to logic 1 (RISE) or from 1 to 0 (FALL). Notably, the RISE and FALL conditions of a signal of the circuit also typically show a high degree of correlation.

Figure 2C:
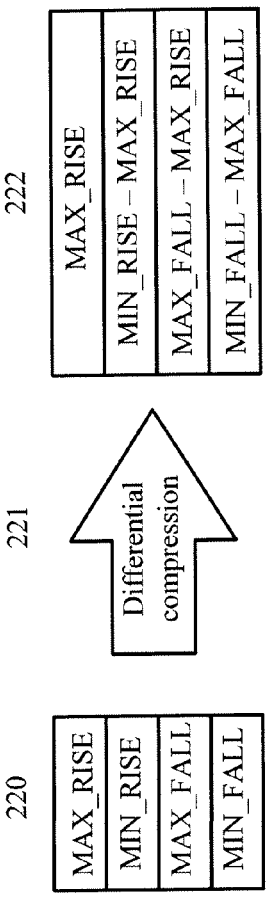
FIG. 2C illustrates the generic differential compression to generate a minimum/maximum/rise/fall vector.

Note that in STA, min/max and rise/fall are analyzed together. Therefore, in one embodiment shown in FIG. 2C, the possible four combination samples 220 (i.e. MAX_RISE, MIN_RISE, MAX_FALL, and MIN_FALL) can be differentially compressed in step 221 into a vector 222. Notably, MAX_RISE is retained as a reference vector and the other vectors are differential vectors, i.e. MIN_RISE–MAX_RISE, MAX_FALL–MAX_RISE, AND MIN_FALL–MAX_FALL. The reference vector would require 32+N*4 bits to store, whereas each of the differential vectors would only require 32+N*2 bits to store. Note that in other embodiments, other base vectors can be used.

Figure 2D:
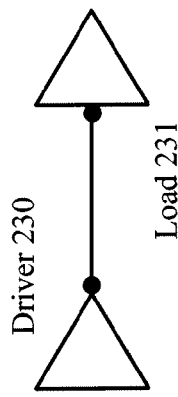
FIG. 2D illustrates two logic gates, wherein an upstream logic gate is associated with a driver pin and a downstream logic gate is associated with a load pin.

Differential compression can also be performed across vectors of two attributes. For example, FIG. 2D illustrates two coupled logic gates, wherein the upstream logic gate has an output pin, which is characterized as a driver 230, and the downstream logic gate has an input pin, which is characterized as a load 231. The transition times of driver 230 and load 231 are two common attributes found in many circuits and analyzed during STA. Notably, load MMRF (min/max, rise/fall) can be highly correlated to driver MMRF.

Figure 2E:
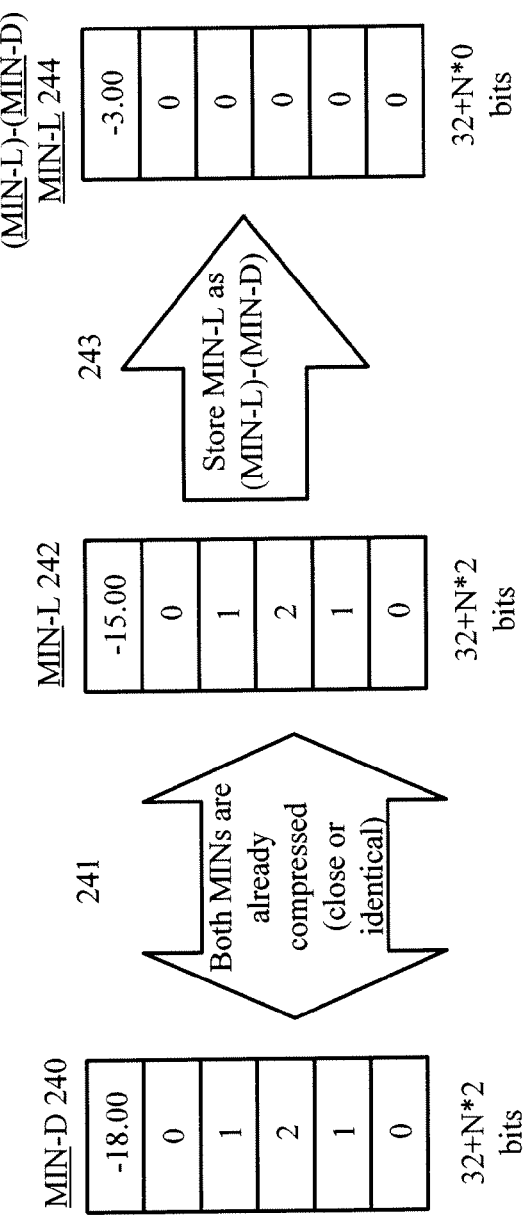
FIG. 2E illustrates that differential compression can also be performed across vectors of two attributes, e.g. the load and driver shown in FIG. 2D.

FIG. 2E illustrates an exemplary MIN-D (D for driver 230) vector 240 and an exemplary $\overline{\text{MIN-L}}$ (L for load 231) vector 242, wherein both vectors 240 and 242 have been compressed (C1 and/or C2) and have substantially identical token values as determined in step 241. In this case, MIN-D vector 240 can be used as the reference vector and $\overline{\text{MIN-L}}$ vector 242 can be further compressed into a $(\overline{\text{MIN-L}})-(\overline{\text{MIN-D}})$ vector 244 by step 243. When the tokens of vectors 240 and 242 are identical (which frequently occurs for second differentials), all tokens of vector 244 are zero, thereby eliminating storage for those tokens. Thus, the storage requirement for vector 244 can be reduced to 32 bits for the base value (in this case −3.00). In one embodiment, $(\overline{\text{MIN-L}})-(\overline{\text{MIN-D}})$ vector 244 can be stored as MIN-L vector $\overline{244}$. Differential compression performed across vectors of two or more attributes is designated C3 compression.

Note that generically, differential compression can be performed across vectors of multiple attributes. For example, FIG. 2D illustrates four coupled logic gates, wherein the upstream logic gate has an output pin, which is characterized as a driver D, and the three downstream logic gates have input pins, which are characterized as loads L1, L2, and L3. Notably, the MMRF (min/max, rise/fall) of loads L1, L2, and L3 can be highly correlated to the MMRF of driver D.

Figure 2F:
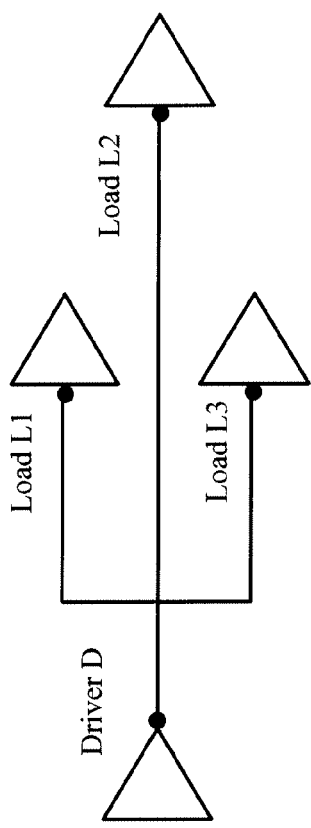
FIG. 2F illustrates four logic gates, wherein an upstream logic gate is associated with a driver pin and three downstream logic gates are associated with three load pins.
Figure 2G:
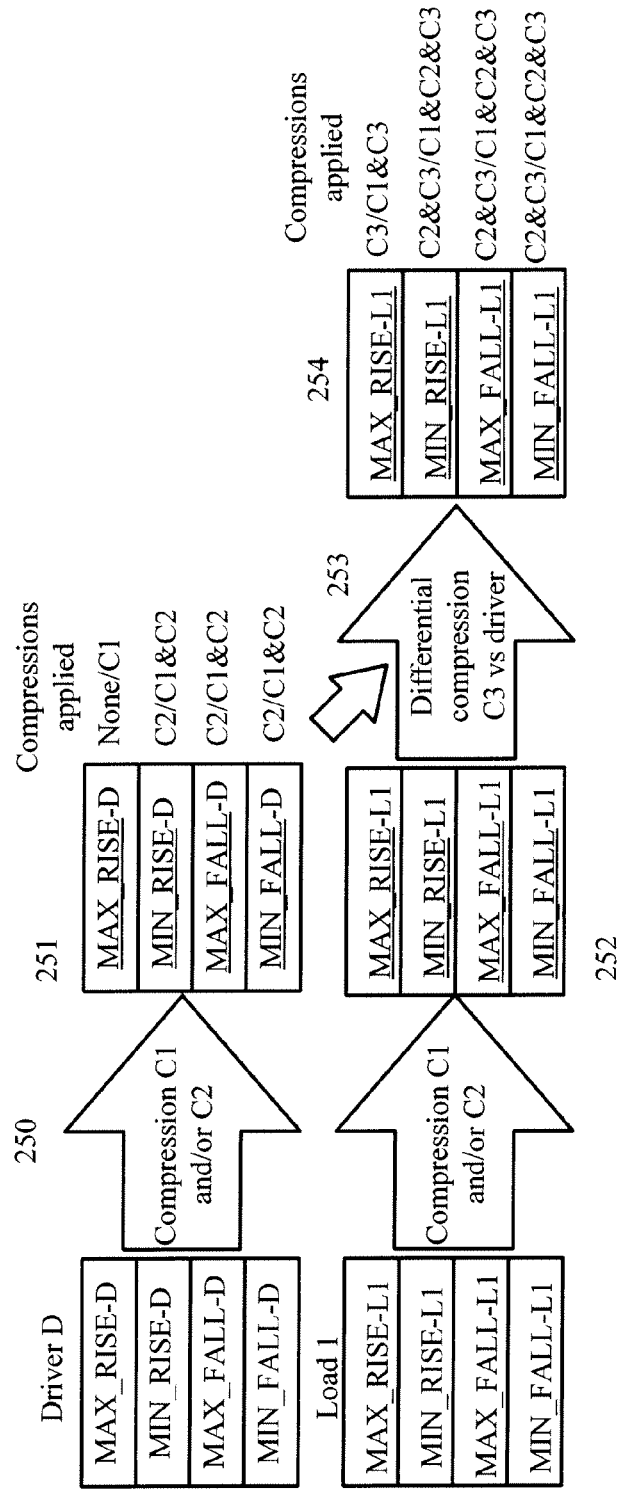
FIG. 2G illustrates that differential compression can also be performed across vectors of multiple attributes, e.g. the three loads and driver shown in FIG. 2F.

FIG. 2F illustrates a generic differential compression across multiple attributes, e.g. driver D and loads L1, L2, and L3. For simplicity, only the differential compression across driver D and load L1 is shown, wherein differential compression across driver D and the other loads L2 and L3 would be similar to that of load L1. As noted in FIG. 2G, driver D has MMRF vectors including MAX_RISE-D, MIN_RISE-D, MAX_FALL-D, and MIN_FALL-D. Similarly, load L1 has MMRF vectors including MAX_RISE-L1, MIN_RISE-L1, MAX_FALL-L1, and MIN_FALL-L1.

Step 250 can provide compression (C1 and/or C2) to the vectors for driver D and load L1 to generate vectors 251 and 252. Vectors 251 can include MAX_RISE-D (resulting from either no compression or $\overline{\text{C1}}$ compression), MIN_RISE-D (resulting from C2 compression, or C1 and $\overline{\text{C2}}$ compressions), MAX_FALL-D (resulting from C2 compression, or C1 and $\overline{\text{C2}}$ compressions), and $\overline{\text{MIN\_FALL-D}}$ (resulting from C2 compression, or $\overline{\text{C2}}$ compressions). Similarly, vectors 252 can include MAX_RISE-L1 (resulting from either no compression or $\overline{\text{C1}}$ compression), MIN_RISE-L1 (resulting from C2 compression, or C1 and C2 compressions), MAX_FALL-L1 (resulting from C2 compression, or C1 and $\overline{\text{C2}}$ compressions), and $\overline{\text{MIN\_FALL-L1}}$ (resulting from C2 compression, or C1 and $\overline{\text{C2}}$ compressions). At this point, step 253 can perform further differential compression, i.e. C3 compression, using vectors 251 and 252 to generate vector 254. Vector 254 can include MAX_RISE-D (resulting from C3 compression, or C1 $\overline{\text{and C3}}$ compressions), MIN_RISE-D (resulting from C2 and C3 compressions, or $\overline{\text{C1, C2, and C3}}$ compressions), MAX_FALL-D (resulting from C2 and C3 compressions, or $\overline{\text{C1, C2, and C3}}$ compressions), and MIN_FALL-D (resulting from C2 and C3 compressions, or C1, C2, and C3 compressions).

FIG. 2H illustrates multiple clock signals Clk 1, Clk 2, Clk 3 arriving at separate arrival times at an output of a logic gate. For example, clock (Clk) 1 has an arrival time Arrival 1 at the output of the logic gate, Clk 2 has an arrival time Arrival 2, and Clk 3 has an arrival time Arrival 3.

FIG. 2I illustrates a generic differential compression across such multiple clock signal arrivals. As noted in FIG. 2I, Arrival 1 has MMRF vectors including MAX_RISE-A1, MIN_RISE-A1, MAX_FALL-A1, and MIN_FALL-A1. Similarly, Arrival 2 has MMRF vectors including MAX_RISE-A2, MIN_RISE-A2, MAX_FALL-A2, and MIN_FALL-A2. For simplicity, only the differential compression across Arrival 1 and Arrival 2 is shown, wherein differential compression across Arrival 1 and Arrival 3 would be similar to that of Arrival 2.

Step 260 can provide compression (C1 and/or C2) to the vectors for Arrivals 1 and 2 to generate vectors 261 and 262. Vectors 261 can include MAX_RISE-A1 (resulting from either no compression or $\overline{\text{C1}}$ compression), MIN_RISE-A1 (resulting from C2 compression, or C1 and $\overline{\text{C2}}$ compressions), MAX_FALL-A1 (resulting from C2 compression, or C1 and $\overline{\text{C2}}$ compressions), and $\overline{\text{MIN\_FALL-A1}}$ (resulting from C2 compression, or C1 and $\overline{\text{C2}}$ compressions). Similarly, vectors 262 can include MAX_RISE-A2 (resulting from either no compression or $\overline{\text{C1}}$ compression), MIN_RISE-A2 (resulting from C2 compression, or C1 and $\overline{\text{C2 compressions}}$), MAX_FALL-A2 (resulting from C2 compression, or C1 and $\overline{\text{C2}}$ compressions), and $\overline{\text{MIN\_FALL-A2}}$ (resulting from C2 compression, or C1 and $\overline{\text{C2}}$ compressions). At this point, step 263 can perform further differential compression, e.g. C3 compression, using vectors 261 and 262 to generate vectors 264. Vectors 264 can include MAX_RISE-A2 (resulting from C3 compression, or C1 and C3 compressions), MIN_RISE-A2 (resulting from C2 and C3 compressions, or $\overline{\text{C1, C2,}}$ and C3 compressions), MAX_FALL-A2 (resulting from C2 and C3 compressions, or $\overline{\text{C1, C2, and C3}}$ compressions), and $\overline{\text{MIN\_FALL-A2}}$ (resulting from C2 and C3 compressions, or $\overline{\text{C1, C2, and C3}}$ compressions).

Thus, as shown above, multi-level differential compression can include correlated vector attributes being compressed as differences within the same vector or versus each other, thereby resulting in differential vectors with much reduced dynamic range.

As described above, mathematical and/or statistical operations may be performed on the circuit attributes for STA. Typical math operations in STA can include addition, subtraction, minimum value, maximum value, and multiplication. Typical statistical operations in STA can include computing the mean, standard deviation, quantile (of one vector), correlation, and/or covariance (between two vectors).

As is known in STA, mathematical operations on vectors of attributes can be easily performed. However, the tokens of the vectors may be quantized. In current practice, these tokens are de-quantized to perform the mathematical or statistical operations and then the results are re-quantized. Because many operations in STA involve the same vectors, runtime is significantly increased to repeatedly de-quantize and re-quantize. Notably, math and statistical operations can be directly performed on the above-described compressed vectors without runtime penalty associated with repeated de-quantization and re-quantization.

Figure 3A:
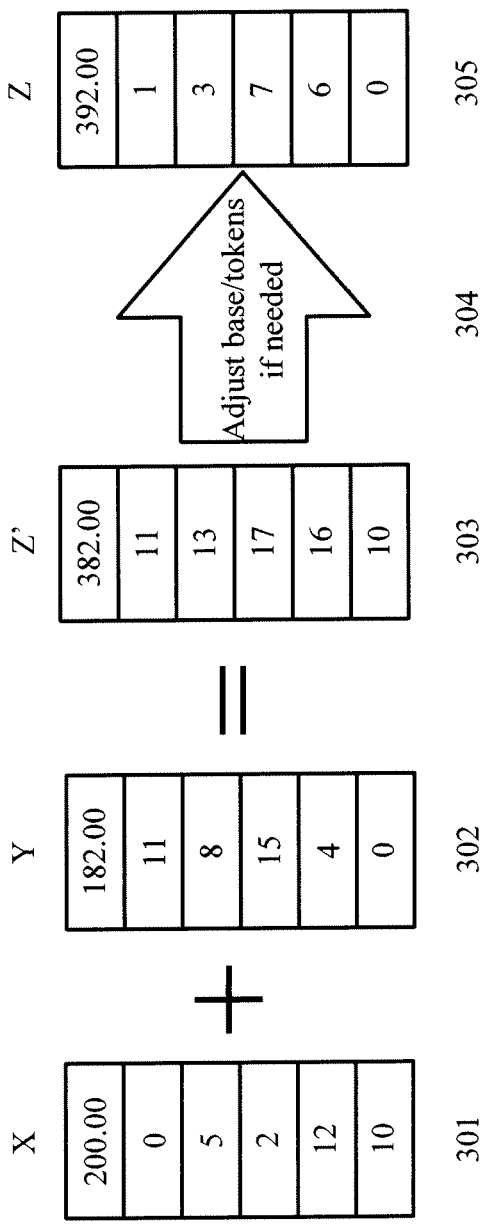
FIG. 3A illustrates an exemplary math operation that can be performed on quantized vectors without de-quantizing or loss of accuracy.

For example, FIG. 3A illustrates an addition operation (X+Y=Z') that can be performed using vectors 301 and 302. Note that vectors 301 and 302 are already quantized. As shown in FIG. 3A, the base values and the tokens of vectors 301 and 302 can be directly added without de-quantization to generate a vector 303 (Z'). In one embodiment, step 304 can adjust vector 303 to ensure a full range of resolution. Note that this adjustment shifts the smallest value (in this case, 10) to zero and adjusts the other tokens as well as the base value (e.g. 13−10=3 (token), 382.00+10=392.00 (base)) in a resulting vector 305 (Z). Thus, step 304 can save storage bits while maintaining the same resolution.

Figure 3B:
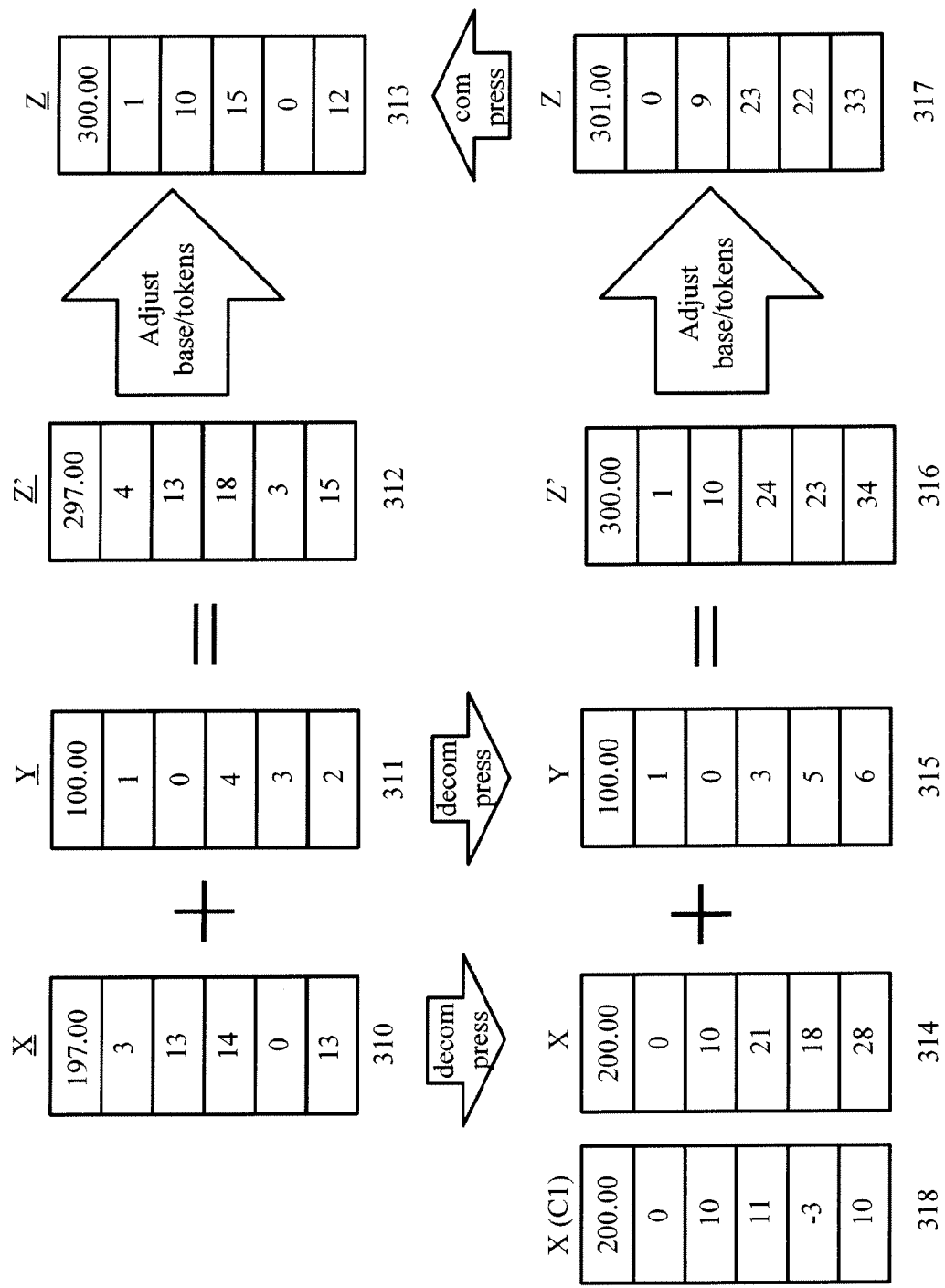
FIG. 3B illustrates an exemplary math operation that can be performed on incrementally compressed vectors without decompressing or loss of accuracy.

FIG. 3B illustrates an addition operation (X+Y=Z') that can be performed using compressed vectors 310, 311, and 312 (X, Y, Z') as well as uncompressed vectors 314, 315, and 316 ($\overline{X}$, $\overline{Y}$, $\overline{Z}'$). Vectors 314, 314, and 315 are uncompressed versions of vectors 310, 311, and 312. For example, vector 318 is an internal, incremental C1 compressed version of vector 314, wherein vector 310 is an adjusted version (smallest token changed to zero, other values adjusted accordingly) of vector 318.

As shown in FIG. 3B, the base values and the tokens of vectors 310 and 312 can be directly added to generate a vector 313 (Z'). Similarly, the base values and the tokens of vectors 314 and 315 can be directly added to generate a vector 316 (Z'). In one embodiment, both vectors 312 and 316 can be adjusted to ensure a full range of resolution, thereby resulting in vectors 313 and 317 ($\underline{Z}$ and Z). This adjustment shifts the smallest tokens in each vector to zero and adjusts the other tokens as well as the base value accordingly. Notably, vector 317 is an uncompressed version of vector 313. Thus, the addition operation can be performed directly on compressed vectors while retaining accuracy. In other embodiments, other mathematical operations or statistical operations can be performed on compressed vectors.

Figure 3C:
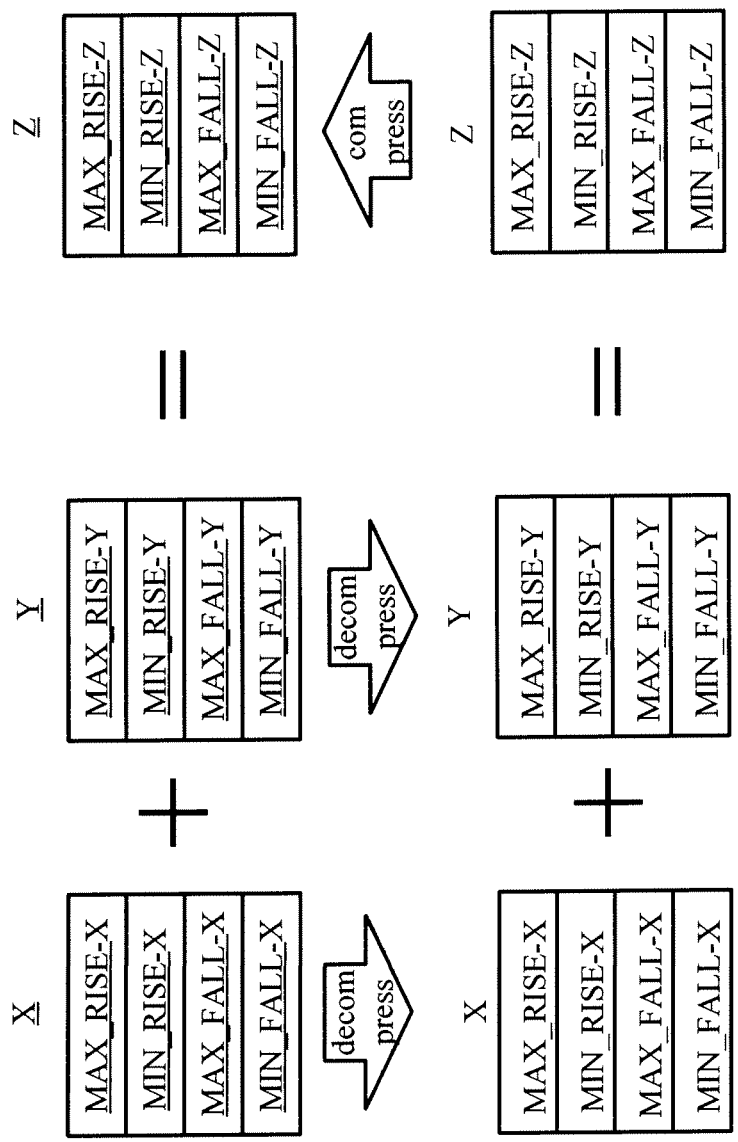
FIG. 3C illustrates a generic exemplary math operation that can be performed on min-max-rise-fall compressed vectors without decompressing or loss of accuracy.

FIG. 3C generically illustrates that vectors of min-max-rise-fall (C2 compression) can also be subjected to mathematical/statistical operation without decompression and retain accuracy. That is, vectors X, Y, and Z are uncompressed versions of X, Y, and Z. Note that MAX_RISE-X, MAX_RISE-$\overline{Y}$, $\overline{MAX\_RISE\_Z}$, MAX_RISE-X, and MAX_RISE-Y and $\overline{MAX\_RISEZ}$ are reference values in the shown vectors.

FIG. 3D illustrates two coupled logic gates, wherein the upstream logic gate receives three clock signals Clk 1, Clk 2, and Clk 3. X and Y designate the input and output pins of the downstream logic gate. FIG. 3E illustrates a generic exemplary math operation that can be performed on the multi-level compressed vectors of FIG. 3D.

Specifically, FIG. 3E illustrates that multiple arrivals of the same arc can be directly computed using compressed vectors (C1, C2, or C3). Notably, only one arrival is calculated using compressed vectors (C3). In this case, only arrival 1 is calculated and is designated the "base". The other arrivals can be copied without calculation by using differential compression. That is, the delay vector (i.e. the delay from X to Y in the logic gate) equally applies to arrival 1, arrival 2, and arrival 3. Therefore, the differentials of arrival 2 and arrival 3 with respect to arrival 1 can apply equally to the X and Y pins.

Thus, the arrival 2@X vector can be copied to the arrival 2@Y vector. Similarly, the arrival 3@X vector can be copied to the arrival 3@Y vector.

Figure 3F:
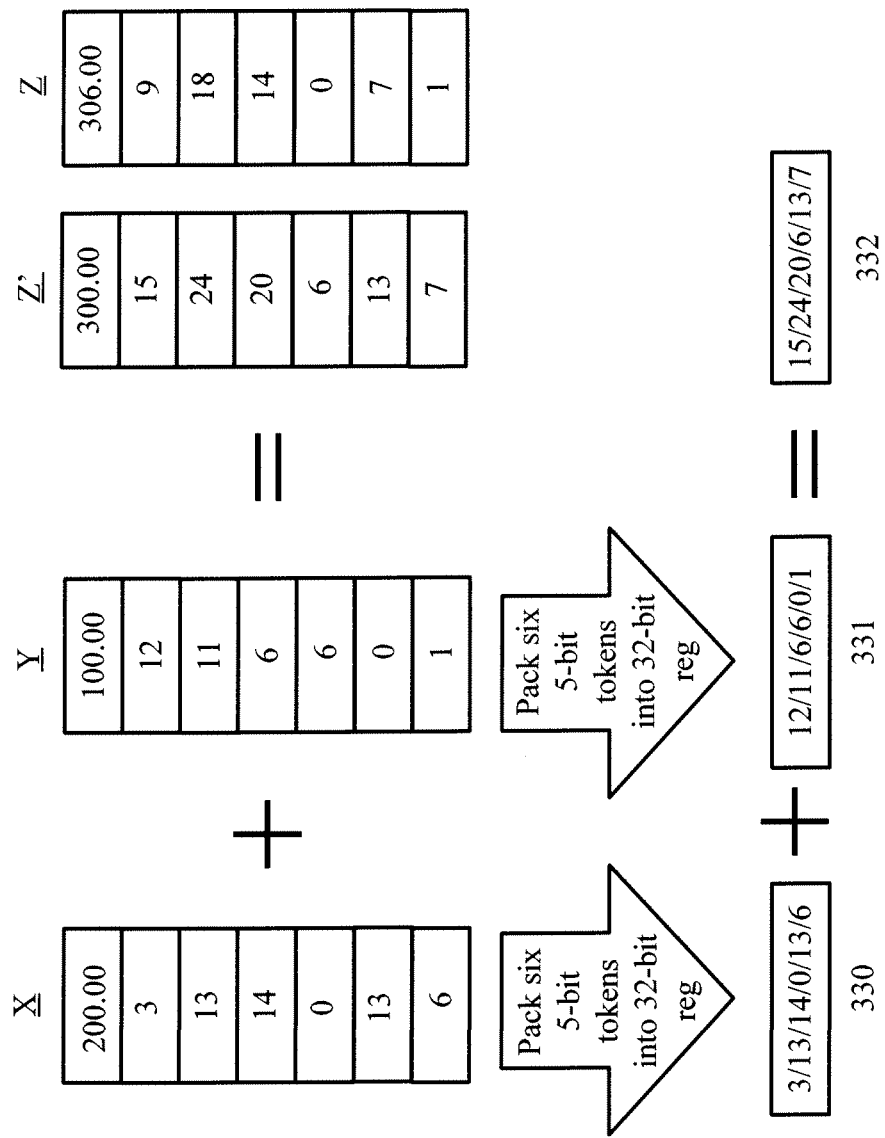
FIG. 3F illustrates how packed math operations on compressed vectors can be efficiently performed using a single machine instruction.

FIG. 3F illustrates that in compressed vector math, it is possible that multiple compressed short tokens can be processed in only one operation (i.e. a single machine instruction). For example, in FIG. 3F, for vectors X and Y, each token is a 4-bit integer (wherein a "short" token is $\overline{4}$ or less bits) and 6 tokens are included in each vector. In one embodiment, each operation for each pair of tokens is assumed to be a 5-bit integer ADD (i.e. 4-bit operands and a carry). Therefore, in one embodiment, vectors $\underline{X}$ and $\underline{Y}$ can be stored in 32-bit registers 330 and 331 with corresponding values being stored in identical positions. In this configuration, the six 5-bit additions can become one 32-bit ADD, i.e. multiple operations can be combined into a single machine instruction, which results in the values shown in a 32-bit register 332. (Note that one 64-bit ADD can take up to twelve 5-bit additions simultaneously. Also note that modern processors support 128-bit or even 256-bit ADD that can perform operations to many more short tokens in a single machine instruction.) Note that vector $\underline{Z}'$ can be subsequently adjusted to shift the smallest token to $\overline{z}$ero and adjust the other values in the vector accordingly, as shown in vector Z.

Figure 4:
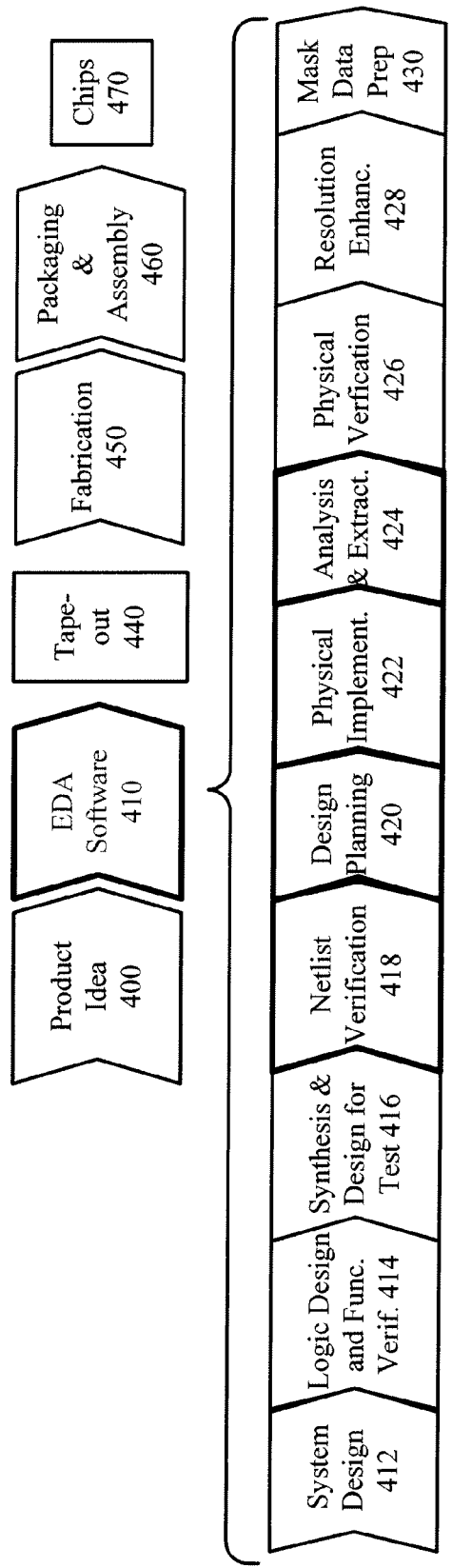
FIG. 4 illustrates shows a simplified representation of an exemplary digital ASIC design flow.

FIG. 4 shows a simplified representation of an exemplary digital ASIC design flow. At a high level, the process starts with the product idea (step 400) and is realized in an EDA software design process (step 410). When the design is finalized, it can be taped-out (event 440). After tape out, the fabrication process (step 450) and packaging and assembly processes (step 460) occur resulting, ultimately, in finished chips (result 470).

The EDA software design process (step 410) is actually composed of a number of steps 412-430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 410) will now be provided:

System design (step 412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 414): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

Netlist verification (step 418): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 420): Here, an overall floorplan for the chip is constructed and analyzed for timing and top-level routing. Exemplary EDA software products from Synopsys, Inc. that can be used at this step include Astro and IC Compiler products.

Physical implementation (step 422): The placement (positioning of circuit elements) and routing (connection of the same) occurs at this step. Exemplary EDA software products from Synopsys, Inc. that can be used at this step include the Astro and IC Compiler products.

Analysis and extraction (step 424): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

In one embodiment, the above-described quantization, compression, and STA operations on vectors subject to this quantization and/or compression can be performed during timing analysis to the circuit, e.g. during steps 418, 420, 422, and 424.

Physical verification (step 426): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 428): This step involves geometric manipulations of the layout to improve manufacturability of the design. Exemplary EDA software products from Synopsys, Inc. that can be used at this step include Proteus, ProteusAF, and PSMGen products.

Mask data preparation (step 430): This step provides the "tape-out" data for production of masks for lithographic use to produce finished chips. Exemplary EDA software products from Synopsys, Inc. that can be used at this step include the CATS(R) family of products.

The above-described quantization and compression for STA can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

The embodiments described herein are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of performing static timing analysis (STA) of an integrated circuit (IC), the method comprising:
   accessing data sets regarding the IC;
   generating vectors of the data sets for the STA, each vector including a base value and a plurality of tokens, each token of the plurality of tokens being quantized;
   for each vector, adjusting data of the vector by:
      shifting a predetermined token to zero and adjusting the base value and remaining token values based on the shifting;
      after said shifting, applying incremental compression within the vector by storing each token value as a difference versus its previous token value; and
      after said applying incremental compression, applying differential compression by storing each token value as a difference versus a corresponding token value in a predetermined reference vector; and
   storing a resulting vector based on the adjusting; and
   performing an operation for the STA using multiple resulting vectors without de-quantizing or decompressing.

2. The method of claim 1, wherein the base value is set to a minimum value in a data set.

3. The method of claim 1, wherein the base value is set to a maximum value in a data set.

4. The method of claim 1, wherein the base value is set to a mean value of a data set.

5. The method of claim 1, wherein the operation is a mathematical operation.

6. The method of claim 1, wherein the operation is a statistical operation.

7. The method of claim 1, further including reducing a token range of the vector.

8. The method of claim 1, further including converting the plurality of tokens to a constant mean value to reduce noise.

9. The method of claim 1, wherein the multiple resulting vectors include two resulting vectors associated with minimum/maximum circuit conditions for one attribute.

10. The method of claim 9, wherein a first vector of the two resulting vectors is a maximum (MAX) vector, and a second vector of the two resulting vectors is a minimum (MIN) vector,
    further including:
    storing the MAX vector as a reference vector;
    performing differential compression across the MIN vector and the MAX vector; and
    storing a MIN-MAX vector as a new MIN vector.

11. The method of claim 1, wherein the multiple resulting vectors include two resulting vectors associated with rise/fall circuit conditions for one attribute.

12. The method of claim 11, wherein a first vector of the two resulting vectors is a rise (RISE) vector, and a second vector of the two resulting vectors is a fall (FALL) vector,
    further including:
    storing the RISE vector as a reference vector;
    performing differential compression across the FALL vector and the RISE vector; and
    storing a FALL-RISE vector as a new FALL vector.

13. The method of claim 1, wherein the multiple resulting vectors include a first vector associated with minimum/maximum/rise/fall circuit conditions for one attribute.

14. The method of claim 13, further including:
storing a MAX_RISE as a reference vector;
performing differential compression across a MIN_RISE and the MAX_RISE, a MAX_FALL and the MAX_RISE, and a MIN_FALL and the MAX_FALL to generate new vectors.

15. The method of claim 1, wherein the multiple resulting vectors include two resulting vectors associated with a condition for two correlated attributes.

16. The method of claim 15, wherein the two resulting vectors are transition times of a driver (a driver vector) and a load (a load vector).

17. The method of claim 16, further including:
using the driver vector as a reference vector; and
performing differential compression across the driver vector and the load vector; and
storing a differentially compressed vector as a new load vector.

18. The method of claim 1, wherein the multiple resulting vectors include multiple resulting vectors associated with conditions for multiple correlated attributes.

19. The method of claim 18, wherein the multiple resulting vectors are transition times of a driver (a driver vector) and multiple loads (multiple load vectors).

20. The method of claim 19, wherein the conditions are minimum/maximum/rise/fall circuit conditions for the driver vector and the multiple load vectors.

21. The method of claim 20, further including for the driver vector:
performing incremental compression.

22. The method of claim 21, further including for each load vector:
performing incremental compression.

23. The method of claim 22, further including for each load vector:
performing differential compression based on the minimum/maximum/rise/fall circuit conditions.

24. The method of claim 23, further including computing a new load vector based on differential compression using the driver vector.

25. The method of claim 1, wherein the multiple resulting vectors are associated with multiple correlated clock arrival times.

26. The method of claim 25, wherein the multiple resulting vectors include minimum/maximum/rise/fall conditions.

27. The method of claim 26, wherein each of the multiple resulting vectors includes a MAX_RISE, a MIN_RISE, a MAX_FALL, and a MIN_FALL for a clock arrival time.

28. The method of claim 27, further including performing incremental compression for each of the multiple resulting vectors.

29. The method of claim 28, further including performing differential compression for each of the multiple resulting vectors.

30. The method of claim 29, further including performing differential compression between two arrival time vectors.

31. The method of claim 1, further including adjusting a post-operation vector using incremental compression.

32. The method of claim 1, wherein the multiple resulting vectors include minimum/maximum/rise/fall conditions for multiple attributes.

33. The method of claim 1, wherein the multiple resulting vectors include minimum/maximum/rise/fall conditions for multiple arrival time attributes.

34. The method of claim 1, further including packing multiple tokens into a register with predetermined bit width, thereby allowing a single machine instruction to perform multiple operations.

35. A computer readable storage device for performing static timing analysis (STA) of an integrated circuit (IC), the computer readable storage device being non-transitory, the computer readable storage device storing instructions to cause at least one processor to perform steps including:
accessing data sets regarding the IC;
generating vectors of the data sets for the STA, each vector including a base value and a plurality of tokens, each token of the plurality of tokens being quantized;
for each vector, adjusting data of the vector by:
shifting a predetermined token to zero and adjusting the base value and remaining token values based on the shifting;
after said shifting, applying incremental compression within the vector by storing each token value as a difference versus its previous token value; and
after said applying incremental compression, applying differential compression by storing each token value as a difference versus a corresponding token value in a predetermined reference vector; and
storing a resulting vector based on the adjusting and compressing; and
performing an operation for the STA using multiple resulting vectors without de-quantizing or decompressing.

36. The computer readable storage device of claim 35, wherein the base value is set to a minimum value in a data set.

37. The computer readable storage device of claim 35, wherein the base value is set to a maximum value in a data set.

38. The computer readable storage device of claim 35, wherein the base value is set to a mean value of a data set.

39. The computer readable storage device of claim 35, wherein the operation is a mathematical operation.

40. The computer readable storage device of claim 35, wherein the operation is a statistical operation.

41. The computer readable storage device of claim 35, further including reducing a token range of the vector.

42. The computer readable storage device of claim 35, further including converting the plurality of tokens to a constant mean value to reduce noise.

43. The computer readable storage device of claim 35, wherein the multiple resulting vectors include two resulting vectors associated with minimum/maximum circuit conditions for one attribute.

44. The computer readable storage device of claim 43, wherein a first vector of the two resulting vectors is a maximum (MAX) vector, and a second vector of the two resulting vectors is a minimum (MIN) vector,
further including:
storing the MAX vector as a reference vector;
performing differential compression across the MIN vector and the MAX vector; and
storing a MIN-MAX vector as a new MIN vector.

45. The computer readable storage device of claim 35, wherein the multiple resulting vectors include two resulting vectors associated with rise/fall circuit conditions for one attribute.

46. The computer readable storage device of claim 45, wherein a first vector of the two resulting vectors is a rise (RISE) vector, and a second vector of the two resulting vectors is a fall (FALL) vector, further including:
storing the RISE vector as a reference vector;
performing differential compression across the FALL vector and the RISE vector; and
storing a FALL-RISE vector as a new FALL vector.

47. The computer readable storage device of claim 35, wherein the multiple resulting vectors include a first vector associated with minimum/maximum/rise/fall circuit conditions for one attribute.

48. The computer readable storage device of claim 47, further including:
storing a MAX_RISE as a reference vector;
performing differential compression across a MIN_RISE and the MAX_RISE, a MAX_FALL and the MAX_RISE, and a MIN_FALL and the MAX_FALL to generate new vectors.

49. The computer readable storage device of claim 35, wherein the multiple resulting vectors include two resulting vectors associated with a condition for two correlated attributes.

50. The computer readable storage device of claim 49, wherein the two resulting vectors are transition times of a driver (a driver vector) and a load (a load vector).

51. The computer readable storage device of claim 50, further including:
using the driver vector as a reference vector; and
performing differential compression across the driver vector and the load vector; and
storing a differentially compressed vector as a new load vector.

52. The computer readable storage device of claim 35, wherein the multiple resulting vectors include multiple resulting vectors associated with conditions for multiple correlated attributes.

53. The computer readable storage device of claim 52, wherein the multiple resulting vectors are transition times of a driver (a driver vector) and multiple loads (multiple load vectors).

54. The computer readable storage device of claim 53, wherein the conditions are minimum/maximum/rise/fall circuit conditions for the driver vector and the multiple load vectors.

55. The computer readable storage device of claim 54, further including for the driver vector:
performing incremental compression.

56. The computer readable storage device of claim 55, further including for each load vector:
performing incremental compression.

57. The computer readable storage device of claim 56, further including for each load vector:
performing differential compression based on the minimum/maximum/rise/fall circuit conditions.

58. The computer readable storage device of claim 57, further including computing a new load vector based on differential compression using the driver vector.

59. The computer readable storage device of claim 35, wherein the multiple resulting vectors are associated with multiple correlated clock arrival times.

60. The computer readable storage device of claim 59, wherein the multiple resulting vectors include minimum/maximum/rise/fall conditions.

61. The computer readable storage device of claim 60, wherein each of the multiple resulting vectors includes a MAX_RISE, a MIN_RISE, a MAX_FALL, and a MIN_FALL for a clock arrival time.

62. The computer readable storage device of claim 61, further including performing differential compression for each of the multiple resulting vectors.

63. The computer readable storage device of claim 62, further including performing incremental compression for each of the multiple resulting vectors.

64. The computer readable storage device of claim 63, further including performing differential compression between two arrival time vectors.

65. The computer readable storage device of claim 35, further including adjusting a post-operation vector using incremental compression.

66. The computer readable storage device of claim 35, wherein the multiple resulting vectors include minimum/maximum/rise/fall conditions for multiple attributes.

67. The computer readable storage device of claim 35, wherein the multiple resulting vectors include minimum/maximum/rise/fall conditions for multiple arrival time attributes.

68. The computer readable storage device of claim 35, further including packing multiple tokens into the register with predetermined bit width, thereby allowing a single machine instruction to perform multiple operations.

* * * * *